United States Patent
Takashima et al.

(10) Patent No.: US 10,086,438 B2
(45) Date of Patent: Oct. 2, 2018

(54) CUTTING TOOL MADE OF DIAMOND-COATED CEMENTED CARBIDE AND METHOD FOR PRODUCING THE SAME

(71) Applicant: MITSUBISHI MATERIALS CORPORATION, Tokyo (JP)

(72) Inventors: Hideaki Takashima, Naka (JP); Hidemitsu Takaoka, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 95 days.

(21) Appl. No.: 15/038,942

(22) PCT Filed: Nov. 28, 2014

(86) PCT No.: PCT/JP2014/081495
§ 371 (c)(1),
(2) Date: May 24, 2016

(87) PCT Pub. No.: WO2015/080237
PCT Pub. Date: Jun. 4, 2015

(65) Prior Publication Data
US 2016/0375497 A1    Dec. 29, 2016

(30) Foreign Application Priority Data

Nov. 29, 2013  (JP) .................................. 2013-247280
Nov. 26, 2014  (JP) .................................. 2014-238392

(51) Int. Cl.
*B23B 27/14*   (2006.01)
*C22C 29/08*   (2006.01)
(Continued)

(52) U.S. Cl.
CPC .............. *B23B 27/148* (2013.01); *B22F 3/10* (2013.01); *B22F 7/06* (2013.01); *B23C 5/16* (2013.01);
(Continued)

(58) Field of Classification Search
USPC .......... 51/307, 309; 428/336, 408, 469, 472, 428/697, 698, 699; 427/438, 468
See application file for complete search history.

(56) References Cited

U.S. PATENT DOCUMENTS 5,164,051 A * 11/1992 Komaki .............. C23C 16/0227
427/249.11
5,236,740 A *  8/1993 Peters ................. C23C 16/0227
427/249.13
(Continued)

FOREIGN PATENT DOCUMENTS

EP    0519587 A    12/1992
JP    07-068425 A   3/1995
(Continued)

OTHER PUBLICATIONS

International Search Report dated Mar. 3, 2015 for the corresponding PCT Application No. PCT/JP2014/081495.
(Continued)

*Primary Examiner* — Archene Turner
(74) *Attorney, Agent, or Firm* — Leason Ellis LLP (57) ABSTRACT

A cutting tool made of diamond-coated cemented carbide includes: a tool body made of tungsten carbide-based cemented carbide including: 3 to 15 mass % of Co; at least one of TaC and NbC of which a total amount is 0.1 to 3.0 mass %; and a balance including WC; and a diamond film coating the tool body, the tool body has a plurality of protrusions on a surface of the tool body, an upper portion of each of the protrusions is made of the at least one of TaC (Continued)

and NbC, and a lower portion of each of the protrusions is made of WC and Co, the lower portion being under the upper portion.

9 Claims, 1 Drawing Sheet

(51) Int. Cl.
| | |
|---|---|
| C23C 30/00 | (2006.01) |
| C23C 16/27 | (2006.01) |
| C22C 1/05 | (2006.01) |
| B22F 3/10 | (2006.01) |
| B22F 7/06 | (2006.01) |
| B23C 5/16 | (2006.01) |
| C04B 37/00 | (2006.01) |
| C04B 41/00 | (2006.01) |
| C04B 41/50 | (2006.01) |
| C04B 41/87 | (2006.01) |
| B22F 5/00 | (2006.01) |

(52) U.S. Cl.
CPC .......... *C04B 37/001* (2013.01); *C04B 41/009* (2013.01); *C04B 41/5002* (2013.01); *C04B 41/87* (2013.01); *C22C 1/051* (2013.01); *C22C 29/08* (2013.01); *C23C 16/271* (2013.01); *C23C 30/005* (2013.01); *B22F 2005/001* (2013.01); *B22F 2301/15* (2013.01); *B22F 2302/10* (2013.01); *B22F 2998/10* (2013.01); *B23B 2222/28* (2013.01); *B23B 2226/275* (2013.01); *B23B 2226/31* (2013.01); *B23B 2228/10* (2013.01); *B23C 2222/28* (2013.01); *B23C 2226/27* (2013.01); *B23C 2226/31* (2013.01); *B23C 2228/10* (2013.01); *C04B 2237/363* (2013.01); *C04B 2237/401* (2013.01); *C04B 2237/405* (2013.01)

(56) References Cited

U.S. PATENT DOCUMENTS

| | | | | |
|---|---|---|---|---|
| 5,391,422 | A | * | 2/1995 | Omori .................. B23B 27/148 428/697 |
| 5,650,059 | A | * | 7/1997 | Shumaker ........... C23C 16/0227 205/640 |
| 5,700,518 | A | | 12/1997 | Lee et al. |
| 5,713,133 | A | * | 2/1998 | Bhat ................... C23C 16/0227 30/346.54 |
| 5,725,932 | A | * | 3/1998 | Lio .................. C04B 35/62222 428/457 |
| 6,096,377 | A | * | 8/2000 | Karner ............... C23C 16/0227 51/307 |
| 6,110,240 | A | * | 8/2000 | Saguchi ............. C23C 16/0227 51/307 |
| 6,387,502 | B1 | * | 5/2002 | Okamura ........... C23C 16/0227 428/408 |
| 6,881,475 | B2 | * | 4/2005 | Ohtani ................. C23C 14/022 428/469 |
| 2006/0099422 | A1 | * | 5/2006 | Gussone ............. C23C 16/0227 428/408 |

FOREIGN PATENT DOCUMENTS

| | | |
|---|---|---|
| JP | 08-039360 A | 2/1996 |
| JP | 08-092741 A | 4/1996 |
| JP | 08-209348 A | 8/1996 |
| JP | 10-130092 A | 5/1998 |
| JP | 2000-144451 A | 5/2000 |
| JP | 2001-293603 A | 10/2001 |
| JP | 2007-083382 A | 4/2007 |
| JP | 2010-520068 A | 6/2010 |
| JP | 2011-074473 A | 4/2011 |
| WO | WO-2008/104944 A | 9/2008 |

OTHER PUBLICATIONS

Extended European Search Report dated Jul. 17, 2017 for the corresponding European Patent Application No. 14866573.0.

* cited by examiner

CUTTING TOOL MADE OF DIAMOND-COATED CEMENTED CARBIDE AND METHOD FOR PRODUCING THE SAME

CROSS-REFERENCE TO RELATED PATENT APPLICATIONS

This application is a U.S. National Phase Application under 35 U.S.C. § 371 of International Patent Application No. PCT/JP2014/081495, filed Nov. 28, 2014, and claims the benefit of Japanese Patent Application No. 2013-247280, filed Nov. 29, 2013 and Japanese Patent Application No. 2014-238392, filed Nov. 26, 2014, all of which are incorporated by reference in their entireties herein. The International Application was published in Japanese on Jun. 4, 2015 as International Publication No. WO/2015/080237 under PCT Article 21(2).

FIELD OF THE INVENTION

The invention relates to a cutting tool made of diamond-coated tungsten carbide-based cemented carbide that is provided with excellent impact resistance and adhesion during high-speed cutting work of difficult-to-cut materials such as CFRP (carbon fiber reinforced plastic) and thereby exhibits excellent chipping resistance and peeling resistance.

BACKGROUND OF THE INVENTION

Conventionally, a cutting tool made of diamond-coated cemented carbide (hereinafter, referred to as "diamond-coated tool") is known, in which a diamond film coats a tool body made of tungsten carbide (WC)-based cemented carbide (hereafter, referred to as "cemented carbide"). In a conventional diamond-coated tool, since the adhesion between a tool body and a diamond film is insufficient, various proposals for improvement of the adhesion have been made, where cobalt inhibiting a formation of diamond is removed from the surface of the tool body made of cemented carbide before forming the diamond film, and then the diamond film is formed on the tool body.

For example, PTL 1 discloses that in a diamond-coated tool, a cemented-carbide body is etched in stages so as to remove Co (cobalt) from a surface of a cemented-carbide body and form concaves and convexes with a size around the diameter of WC particles on the cemented-carbide body, and then a diamond film is deposited, thereby improving adhesion between the diamond film and the cemented-carbide tool body.

PTL 2 discloses that in a diamond-coated tool, an intermediate layer made of W (tungsten) or the like coats the cemented-carbide body on which the concaves and convexes are formed by electrolytic etching, and then the intermediate layer is coated with a diamond film, thereby improving adhesion between the diamond film and the tool body.

For example, PTL 3 discloses that before coating a cemented-carbide tool body with diamond, carbides of one or more metals selected from Groups IVa, Va, and VIa of the Periodic Table of elements, or ceramic particles such as silicon carbide, alumina are embedded into a surface of the cemented-carbide tool body. In PTL3, the surface of the cemented-carbide tool body is subjected to the electrolytic etching so as to have concave and convex surfaces, thereby improving adhesion between the tool body and the diamond film.

CITATION LIST

Patent Literature

[PTL 1] European Patent No. 519587
[PTL 2] Japanese Unexamined Patent Application, First Publication No. 2000-144451
[PTL 3] Japanese Unexamined Patent Application, First Publication No. H8-92741

Technical Problem

Recently, in the technical field of cutting work, there has been a strong demand for power saving, energy saving, and a reduction in cost. In accordance with this, there is a tendency toward an increase in the speed of the cutting work. When the conventional diamond-coated tool is used, for example, in high-speed cutting of difficult-to-cut materials such as CFRP with high accuracy, a drill requires a sharp edge tip and in particular, high edge tip strength. However, a conventional diamond-coated tool has insufficient edge tip strength, and thus the diamond film easily peels. Therefore, there are many cases in which a conventional diamond-coated tool does not exhibit sufficient chipping resistance and peeling resistance in long-term usage, and as a result, reaches the end of its service life within a relatively short time.

For example, even when as disclosed in PTL 1, the amount of binder, that is, Co, in the vicinity of the surface of the tool body is decreased so that the adhesion between the diamond film and tool body is improved, impact is repeatedly applied to the edge tip during high-speed cutting work of CFRP or the like. Therefore, there is a problem in that the strength in the vicinity of the edge tip is not sufficient and chipping or peeling occurs, which results in a shorter service life as a cutting tool.

When the pretreatment disclosed in PTL 2 is performed, the electrolytic etching makes WC and Co elute simultaneously. Therefore, it is difficult to maintain the strength of the convexes, and there is a problem in the adhesion between the tungsten intermediate layer and the cemented-carbide body. In PTL 3, SiC particles embedded into the cemented-carbide body function as a mask inhibiting the body from being etched, thereby forming the convexes on the cemented-carbide body. However, it is difficult to embed a SiC particle between WC particles without spaces therebetween, and to embed the SiC particles, which are hard ceramics, into the hard cemented-carbide body.

A technical problem to be solved in the present invention, that is, an object of the present invention is to provide a diamond-coated tool which exhibits improved chipping resistance and peeling resistance and has a long service life by improving the adhesion between a diamond film and a tool body and the edge tip strength of a diamond-coated tool.

SUMMARY OF THE INVENTION

Solution to Problem

The inventors intensively and repeatedly conducted research and experiments related to the above-described problems in the diamond-coated tool. As a result, the inventors found the following. In a conventional diamond-coated tool, as described above, in order to improve the adhesion between the diamond film and the tool body, the treatment for removing Co contained in the metallic binder on the outermost surface of the tool body, is performed. The removal of Co causes a decrease in the toughness of the edge tip, which results in a decrease in the edge tip strength.

Therefore, the inventors have intensively and repeatedly conducted research focusing Co contained in the metallic binder in the vicinity of the surface of the tool body, in order to provide a diamond-coated tool which has a superior edge tip strength and exhibits excellent wear resistance in long-term usage even when the diamond-coated tool is used for cutting work in which a high load is applied to a cutting edge, such as high-speed drilling or high-speed milling of CFRP or the like. As a result, the inventors obtained the following knowledge.

(1) When a cemented-carbide body contains TaC (tantalum carbide) and NbC (niobium carbide), depending on sintering conditions, crystal grains of TaC and NbC grow between WC particles during sintering, and thereby TaC and NbC crystal grains are formed between the WC particles without spaces therebetween.

(2) Therefore, a Co binder which has been present between WC particles where TaC and NbC crystal grains are to be formed is extruded outward of TaC, NbC, and the area between WC particles during sintering.

(3) When the tool body of the above (1) and (2) is subjected to first pretreatment step using acid solution (acid mixed solution), that is, chemical etching (dilute sulfuric acid+ hydrogen peroxide water), Co etching do not proceed in areas where TaC or NbC exists in the vicinity of the surface of the tool body.

(4) Co which has not removed by acid treatment (the first pretreatment step) exists immediately under TaC and NbC in the vicinity of the surface of the tool body. Then, the tool body is subjected to electrolytic etching using alkaline etchant containing NaOH (second pretreatment step), thereby removing WC particles around TaC and NbC. Further, by a step of removing Co from the surface of the tool body using acid (third pretreatment step), protrusions in each of which TaC and NbC remain at the upper portion thereof are formed.

(5) Thereafter, a diamond film is formed on the cemented-carbide body, and thus the protrusions in which TaC and NbC remain at the upper portion thereof exist inside the diamond film in such a manner the protrusions bite into the diamond film as a wedge. Thus, due to effect of shape, adhesion of a diamond film becomes stronger and thereby chipping or peeling can be suppressed.

The present invention is made based on the above-described knowledge and has the following characteristics.

[1] A cutting tool made of diamond-coated cemented carbide, the cutting tool including:
a tool body made of tungsten carbide-based cemented carbide including: 3 to 15 mass % of Co; at least one of TaC and NbC of which a total amount is 0.1 to 3.0 mass %; and a balance including WC; and
a diamond film coating the tool body,
wherein the tool body has a plurality of protrusions on a surface of the tool body, of which an average height is 1.0 to 3.0 μm, an average width is 0.5 to 6.0 μm, and an average aspect ratio of the height to the width is 0.5 to 3.0;
an upper portion of each of the protrusions is made of the at least one of TaC and NbC; and
a lower portion of each of the protrusions is made of WC and Co, the lower portion being under the upper portion.

[2] The cutting tool made of diamond-coated cemented carbide according to [1], wherein the number of the protrusions per unit area is 500 to 10000/mm$^2$.

[3] The cutting tool made of diamond-coated cemented carbide according to [1] or [2], wherein an average film thickness of the diamond film is 3 to 30 μm.

[4] The cutting tool made of diamond-coated cemented carbide according to any one of [1] to [3], wherein
the diamond film has a plurality of bumps on a surface of the diamond film, of which an average height is 1.0 to 3.0 μm, and an average width is 3.0 to 20.0 μm.

[5] The cutting tool made of diamond-coated cemented carbide according to [4], wherein the number of the humps per unit area is 500 to 10000/mm$^2$.

[6]. The cutting tool made of diamond-coated cemented carbide according to any one of [1] to [5], wherein a Co content is 2 to 13 mass % in the lower portion.

[7]. The cutting tool made of diamond-coated cemented carbide according to any one of [1] to [6], wherein a total amount of the at least one of TaC and NbC is 95 to 100 mass % in the upper portion.

[8] A method for producing the cutting tool made of diamond-coated cemented carbide according to any one of [1] to [7], the method including:
a granulating step of granulating a Co powder, at least one of a TaC powder and a NbC powder, and a WC powder using a spray dryer at 190 to 210° C.;
a sintering step of: mixing the granulated Co powder, the at least one of TaC powder and NbC powder, and the WC powder with each other to obtain a mixture and then holding the mixture at 0.1 to 10 Pa and 1380 to 1500° C. for 1 to 2 hours to sinter the mixture and form the tool body;
a first pretreatment step of immersing the tool body in an acid solution containing dilute sulfuric acid and hydrogen peroxide water;
a second pretreatment step of subjecting the tool body which has been subjected to the first pretreatment step to electrolytic etching by immersing the tool body in an alkaline etchant with a concentration of 5 to 15 volume % containing sodium hydroxide for 30 to 60 minutes while an electric current at 1.5 to 2.5 A/dm$^2$ is passed through the alkaline etchant;
a third pretreatment step of immersing the tool body which has been subjected to the second pretreatment step in an acid solution containing dilute sulfuric acid and hydrogen peroxide water; and
a step of coating the tool body which has been subjected to the third pretreatment step with the diamond film.

Here, in the present invention, "an upper portion of each of the protrusions" means at least one of TaC and NbC which as a result of etching, remains on a diamond film side of a protrusion without being removed by etching. "A lower portion of each of the protrusions" means a portion which is located under above-mentioned the upper portion (at a tool body side of a protrusion) and is constituted by Co and WC particles remaining without being removed by etching due to the TaC and NbC existing upside thereof. Each of the protrusions is constituted only by the upper portion and the lower portion.

Advantageous Effects of Invention

The cutting tool made of diamond-coated cemented carbide of the present invention includes: the tool body made of tungsten carbide-based cemented carbide including: 3 to 15 mass % of Co; at least one of TaC and NbC of which the total amount is 0.1 to 3.0 mass %; and a balance including WC; and the diamond film coating the tool body. The tool body has a plurality of protrusions on the surface thereof, of which the average height is 1.0 to 3.0 μm, the average width is 0.5 to 6.0 µm, and the average aspect ratio of the height to the width is 0.5 to 3.0, the upper portion of each of the protrusions is made of the at least one of TaC and NbC, and the lower portion under the upper portion of each of the protrusions is made of WC and Co. Thereby, adhesion between the tool body and the diamond film and edge tip strength are improved. According to the cutting tool made of diamond-coated cemented carbide of the present invention, in cutting work of CFRP or the like, it is possible to exhibit excellent edge tip strength and wear resistance, which results in great advantages. Additionally, the number of the protrusions per unit area is 500 to 10000/mm², whereby it is possible to further improve the adhesion between the tool body and the diamond film, and the edge tip strength, which results in greater advantages.

DETAILED DESCRIPTION OF THE INVENTION

Hereinafter, an embodiment of the present invention will be described in detail with reference to the drawings.

A cutting tool made of diamond-coated cemented carbide according to this embodiment includes: a tool body 12 made of tungsten carbide-based cemented carbide including: 3 to 15 mass % of Co; at least one of TaC and NbC in which the total amount thereof is 0.1 to 3.0 mass %; and a balance including WC, and a diamond film 5 coating the tool body 12. In the cutting tool made of diamond-coated cemented carbide 100 of this embodiment, as shown schematically in FIG. 1, the tool body 12 has a plurality of protrusions 13 on a surface of the tool body 12, of which the average height 7 is 1.0 to 3.0 µm, the average width 6 is 0.5 to 6.0 µm, and the average aspect ratio of the height 7 to the width 6 is 0.5 to 3.0. Further, an upper portion 8 of each of the protrusions 13 is made of the at least one of TaC and NbC (numeral 1). A lower portion 9 of each of the protrusions 13, which is positioned under the upper portion 8 is made of WC (numeral 2) and Co (Co binder 4).

Next, the reason that each of the constitutions is specified as described above and the preferable constitutions will be described.

(Co content in the cemented carbide constituting the tool body: 3 to 15 mass %)

Figure 1:
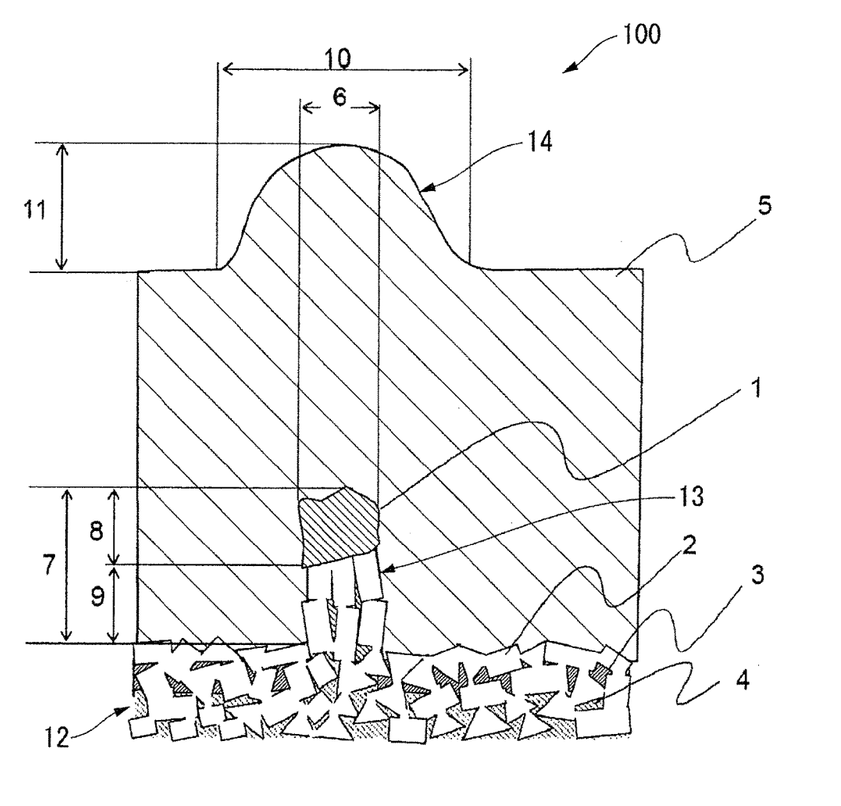
FIG. 1 is a schematic view of a film configuration which schematically shows cross-section of the diamond film according to an embodiment of the present invention.

When the Co content in the cemented carbide constituting the tool body 12 is less than 3 mass %, the toughness of the tool body 12 is low and thus fracture easily occurs during cutting, which is not preferable. On the other hand, when the Co content exceeds 15 mass %, after etching, the volume fraction of voids (pores) 3 in the region from which Co removed becomes large. Therefore, this region from which Co removed becomes brittle and thus interface strength between the diamond film 5 and the surface of the tool body 12 becomes low, which is not preferable. Accordingly, the Co content in the cemented carbide is 3 to 15 mass %. The Co content in the cemented carbide is preferably 5 to 7 mass %, although it is not limited thereto.

(Total amount of at least one of TaC and NbC in the cemented carbide constituting the tool body: 0.1 to 3.0 mass %)

When the total amount of at least one of TaC and NbC in the cemented carbide constituting the tool body 12 is less than 0.1 mass %, the density of the protrusions 13 (the number thereof per unit area) is less than 500/mm² and thus the desired effects of the protrusions 13 cannot be obtained. On the other hand, when the total amount of TaC and NbC which are hard particles exceeds 3.0 mass %, the toughness of the tool body 12 is low and thus fractures easily occur. Accordingly, the total amount of at least one of TaC and NbC in the cemented carbide constituting the tool body 12 is 0.1 to 3.0 mass %. The total amount of at least one of TaC and NbC in the cemented carbide is preferably 0.5 to 1.5 mass %, although it is not limited thereto.

(Average height of a plurality of the protrusions formed on the surface of the tool body: 1.0 to 3.0 µm)

When the average height 7 of a plurality of the protrusions 13 formed on the surface of the tool body 12 is less than 1.0 µm, undulation of the protrusions 13 is small and thus sufficient adhesion with the diamond film 5 cannot be obtained. On the other hand, when the average height 7 of a plurality of the protrusions 13 exceeds 3.0 µm, the diamond film 5 may peel from the protrusions 13 as a starting point during cutting. Accordingly, the average height 7 of a plurality of the protrusions 13 formed on the surface of the tool body 12 is 1.0 to 3.0 µm. The average height 7 of a plurality of the protrusions 13 is preferably 1.5 to 2.0 µm, although it is not limited thereto.

(Average width of a plurality of the protrusions formed on the surface of the tool body: 0.5 to 6.0 µm)

When the average width 6 of a plurality of the protrusions 13 formed on the surface of the tool body 12 is less than 0.5 µm, a few particles of WC constitute each of the protrusion 13. Therefore, the strength of the protrusions 13 weakens and thus sufficient adhesion with the diamond film 5 cannot be obtained. On the other hand, the average width 6 of a plurality of the protrusions 13 exceeds 6.0 µm, the diamond film 5 may peel from the protrusions 13 as a starting point during cutting. Accordingly, the average width 6 of a plurality of the protrusions 13 formed on the surface of the tool body 12 is 0.5 to 6.0 µm. The average width 6 of a plurality of the protrusions 13 is preferably 1.5 to 3.0 µm, although it is not limited thereto.

(Average aspect ratio of the height to the width of the protrusions formed on the surface of the tool body: 0.5 to 3.0)

When the average aspect ratio of the height 7 to width 6 (height/width) of the protrusions 13 formed on the surface of the tool body 12 is less than 0.5, undulation of the protrusions 13 is small and thus sufficient adhesion with the diamond film 5 cannot be obtained. On the other hand, when the average aspect ratio of the protrusions 13 exceeds 3.0, the strength of the protrusions 13 weakens and thus sufficient adhesion with the diamond film 5 cannot be obtained. Accordingly, the average aspect ratio of height 7 to the width 6 of the protrusions 13 formed on the surface of the tool body 12 is 0.5 to 3.0. The average aspect ratio is preferably 0.7 to 1.3, although it is not limited thereto.

(The number of the protrusions per unit area: 500 to 10000/mm²)

The number of protrusions 13 formed on the surface of the tool body 12 per unit area is preferably 500 to 10000/mm². When the number is less than 500/mm², sufficient adhesion with the diamond film 5 cannot be obtained. On the other hand, when the number exceeds 10000/mm², the total amount of at least one of TaC and NbC in cemented carbide constituting the tool body 12 is large. Therefore, the toughness of the tool body 12 is low and thus fracture may occur. Accordingly, it is preferable that the number of protrusions 13 formed on the surface of the tool body 12 per unit area be preferably 500 to 10000/mm$^2$. The number of the protrusions 13 per unit area is more preferably 4000 to 7000/mm$^2$, although it is not limited thereto.

(Co content in the lower portion of the protrusion: 2 to 13 mass %)

It is preferable that the lower portion 9 of each of the protrusions 13 formed on the surface of the tool body 12 be formed only from WC (numeral 2 of FIG. 1) and Co (Co binder 4), and the Co content in the lower portion 9 is 2 to 13 mass %. In this case, the strength at the lower portion 9 of the protrusion 13 is not significantly lower than that of the inside of the tool body 12. Therefore, the diamond film 5 is difficult to peel from the protrusions 13 as a starting point, and thus the adhesion with the diamond film 5 can be further improved. The Co content in the lower portion 9 of each of the protrusions 13 is more preferably 2 to 13 mass %, although it is not limited thereto.

(Total amount of at least one of TaC and NbC in the upper portion of the protrusion: 95 to 100 mass %)

It is preferable that the upper portion 8 of each of the protrusions 13 formed on the surface of the tool body 12 contain at least one TaC and NbC as a main component, and the total amount of at least one of TaC and NbC in the upper portion 8 is 95 to 100 mass %. In the example shown in FIG. 1, only one crystal grain 1 made of TaC or NbC constitutes the upper portion 8. By setting the total amount of at least one of TaC and NbC in the upper portion 8 within the above-described range, the Co content in the upper portion is small, and thus the lower portion can be inhibited from being etched. The total amount of at least one of TaC and NbC in the upper portion 8 of each of the protrusions 13 is more preferably 95 to 100 mass %, although it is not limited thereto.

(Average film thickness of the diamond film: 3 to 30 μm)

In this embodiment, it is preferable that the diamond film 5 coating the surface of the tool body 12 have an average film thickness of 3 to 30 μm. When the average film thickness is less than 3 μm, it is not possible to exhibit sufficient wear resistance and peeling resistance in long-term usage. On the other hand, when the average film thickness of the diamond film 5 exceeds 30 μm, chipping, fracture and peeling easily occur and working accuracy degrades. Accordingly, the average film thickness of the diamond film 5 is preferably 3 to 30 μm. In order to satisfy both of wear resistance and work accuracy of tool, the average film thickness is more preferably 10 to 15 μm, although it is not limited thereto.

(The number of bumps formed on the surface of the diamond film per unit area: 500 to 10000/mm$^2$)

When a plurality of bumps 14 are formed on the surface of the diamond film 5 due to the protrusions 13 formed on the surface of the tool body 12, it is preferable that the number of the bumps 14 per unit area be 500 to 10000/mm$^2$. When the number is less than 500/mm$^2$, since the number of the protrusions 13 per unit area is low, sufficient adhesion with the diamond film 5 cannot be obtained. On the other hand, when the number of the bumps 14 per unit area exceeds 10000/mm$^2$, that is, when the number of the protrusion 13 exceeds 10000/mm$^2$, the fraction of the total amount of at least one of TaC and NbC in the cemented carbide constituting the tool body 12 is large. Therefore, the toughness of the tool body 12 is low, fracture may occur. Accordingly, the number of the bumps 14 formed on the surface of the diamond film 5 per unit area is preferably 500 to 10000/mm$^2$. The number of the bumps 14 per unit area is more preferably 4000 to 7000/mm$^2$, although it is not limited thereto.

(Average height of a plurality of the bumps formed on the surface of the diamond film: 1.0 to 3.0 μm)

The average height 11 of the bumps 14 formed on the surface of the diamond film 5 is preferably 1.0 to 3.0 μm. In this case, it is possible to obtain the advantages in which adhesion between the diamond film and the tool body can be improved. The average height 11 of a plurality of the bumps 14 is preferably 1.5 to 2.0 μm, although it is not limited thereto.

(Average width of a plurality of the bumps formed on the surface of the diamond film: 3.0 to 20.0 μm)

The average width 10 of the bumps 14 formed on the surface of the diamond film 5 is preferably 3.0 to 20.0 μm. In this case, the contact area with work material can be reduced during cutting, and thus cutting resistance can be reduced. In addition to this, chip discharging efficiency can be improved. The average width 10 of a plurality of the bumps 14 is more preferably 8 to 15 μm, although it is not limited thereto.

Here, by forming the bumps 14 on the surface of the diamond film 5, it is possible to improve tribological characteristics during cutting. Specifically, during the cutting work of metal, it is possible to improve tribological characteristics of the cutting tool made of diamond-coated cemented carbide. On the other hand, when the bumps 14 are not provided on the surface of the diamond film 5 (for example, bumps 14 formed due to the protrusions are removed by grinding or the like), it is possible to improve processing properties including working accuracy.

(Measuring Method)

It is preferable to determine: the height 7, the width 6, the aspect ratio of the height 7 to the width 6, and the number per unit area of the protrusions 13 on the surface of the tool body 12; the height 11, the width 10, and the number per unit area of the bumps 14 on the surface of the diamond film 5; and the film thickness of the diamond film 5, in the following manner.

First, in the vicinity of the surface of the tool body 12, the cross section perpendicular to the surface of the tool body 12 is observed using a scanning electron microscope. The measurements are performed on a plurality of the protrusions 13 and bumps 14 observed in the images obtained in an observation area with 10 μm in a film-thickness direction from the interface (the surface of the tool body 12) between the diamond film 5 and the cemented-carbide body (tool body 12); and 100 μm in a direction parallel to the surface of the tool body 12.

For measuring the height 7 and the width 6 of the protrusions 13, in the above-mentioned observation area, regions constituted by crystal grains of TaC or NbC (numeral 1 of FIG. 1), that is, the upper portions 8 are identified by Auger electron spectroscopy. The maximum value of the width of each of the upper portions 8 in the direction parallel to the surface of the tool body 12 is defined as the width 6 of each of the protrusions 13. Further, a point of each of the upper portions 8 which is the most distant from the surface of the tool body 12 is used as a first point. A final point where WC or Co is detected during line analysis in the film-thickness direction is used as a second point. The distance between the first point and the second point is defined as the height 7 of each of the protrusions 13.

Then, the height 7 is divided by the width 6 of each of the protrusions 13, arithmetic average thereof is calculated, and thereby the aspect ratio of the protrusions 13 is obtained.

In addition, the height 11 of each of the bumps 14 is measured using the scanning electron microscope. The surface of the diamond film 5 is used as a reference level, and a point on each of the bumps 14 which is the most distant from the reference level is used as an end point. The distance from the reference level to the end point is defined as the height 11 of each of the bumps 14. Regarding the width 10 of each of the bumps 14, the surface of the diamond film 5 is observed using a laser microscope. The region in which height difference from the reference level exceeds 1 μm is defined as the bump. The maximum diameter of the outline of each of the bumps (aggregation of points indicating end of each of the bump) is defined as the width 10 of each of the humps 14.

Regarding the average film thickness of the diamond film 5, in a cross-section of the edge tip of the tool, film thicknesses are measured at arbitrary five points in the region where the protrusion 13 is not formed, using the scanning electron microscope. The arithmetic average thereof is calculated and is defined as the average film thickness.

The number of the bumps 14 per unit area is measured using the scanning electron microscope by observing arbitrary three visual fields with 100 μm square on the surface of the diamond film 5. In each visual field, the number of the bumps 14 formed on the diamond film 5 per unit area is calculated. The arithmetic average of the numbers of the three visual fields is calculated and is defined as the number of the humps 14 per unit area.

When a plurality of the bumps 14 due to the protrusions 13 formed on the surface of the tool body 12 are formed on the surface of the diamond film 5, the number of the bumps 14 per unit area is assumed as the number of the protrusions 13 per unit area. On the other hand, when a plurality of the bumps 14 due to the protrusions 13 formed on the surface of the tool body 12 are not formed, a confocal Raman microspectroscope employing a confocal optical system is used. Arbitrary three visual fields with 100 μm square are scanned while setting the confocal point at a point which is 1 μm away from the surface of the tool body in the film thickness direction toward the diamond film. Two-dimensional image is created from the peak intensity of signals indicating $sp^3$ binding. In the obtained image, the regions without peak intensity of signals indicating $sp^3$ binding are assumed as the protrusions 13, and the number of the protrusions 13 per unit area is calculated. The arithmetic average of the numbers of the three visual fields is calculated and is defined as the number of the protrusions 13 per unit area.

(Producing Method)

The above-described diamond-coated tool 100 of this embodiment and the tool body 12 thereof can be produced by the following processes.

(1) First, WC-based cemented carbide including a Co powder and at least one of a TaC powder and a NbC powder is sintered. In the WC-based cemented carbide, the Co content is 3 to 15 mass %, the total amount of at least one of TaC or NbC is 0.1 to 3.0 mass %, and the balance is WC. Here, in order to make crystal grains of TaC and NbC grown, the particle diameter of the TaC and NbC powder is preferably about 1 μm (in detail, 0.8 to 1.3 μm). More preferably, the TaC and NbC powder is constituted by fine particles with a diameter of 1 μm or less. The crystal grains of TaC and NbC grow through sintering, and the crystal grains of TaC and NbC are formed between the WC particles without space therebetween. The particle diameter of the Co powder is preferably 1 to 2 μm and the particle diameter of the WC powder is preferably 0.5 to 1.5 μm. It is preferable that these powders be granulated using a spray dryer at about 200° C. (190 to 210° C.).

It is preferable that these powders are compacted and then held in a vacuum atmosphere (0.1 to 10 Pa) at 1380 to 1500° C. for 1 to 2 hours to be sintered, thereby producing a sintered body.

(2) Secondly, the sintered body is polished thereby forming the tool body 12 made of the cemented carbide.

(3) As a first pretreatment step, the tool body is immersed in 1 liter of an acid mixed solution containing dilute sulfuric acid (1.0 volume %) and hydrogen peroxide (3 volume %) at room temperature (23° C.) for 15 to 25 seconds, thereby removing Co from the vicinity of the surface of the cemented-carbide body through etching. In the acid mixed solution, the concentration of the dilute sulfuric acid is preferably 0.4 to 1.0 volume % and the concentration of the hydrogen peroxide is preferable 2 to 5 volume %. The immersing temperature is preferable 20 to 25° C. It is preferable that a part of the Co binder be removed to a depth of 5 to 6 μm through the first pretreatment step.

(4) Next, as a second pretreatment step, the electrolytic etching is performed in 1 liter of etchant (of which the concentration is 5 to 15 volume %) containing NaOH (50 to 150 g) for 30 to 60 minutes, while an electric current is passed through the etchant in such a manner that the amount of the electric current per unit area is 1.5 to 2.5 A/dm². Thereby, WC is removed from the surface of the tool body. The shape of each of the protrusions formed by the second pretreatment step is controlled through the amount of electric current applied during the etching, the concentration of the alkaline etchant, the etching time, the amount of TaC or NbC constituting the cemented-carbide body, the particle diameter of raw powder of TaC or NbC used for the forming the tool body, the granulating step, and the sintering step.

(5) Next, as a third pretreatment step, the tool body is immersed for 8 to 15 seconds at room temperature (20 to 25° C.) in 1 liter of an acid mixed solution containing 0.4 to 1.0 volume % of dilute sulfuric acid and 2 to 5 volume % of hydrogen peroxide. Thereby, a part of the Co binder is removed to a depth of 5 to 6 μm.

(6) Then, through a hot-filament CVD process, the diamond film 5 with the average film thickness of 3 to 30 μm is formed on the tool body 12.

FIG. 1 shows the schematic view of the cross-section of the interface between the diamond film and the tool body of the diamond-coated tool of this embodiment produced by the above-described method. As a result of the observation of the cross-section of the diamond-coated tool of this embodiment produced by the above-described method using the scanning electron microscopy, the followings were confirmed. There were a plurality of the protrusions 13 on the interface between the diamond film 5 and the cemented-carbide tool body 12. The average height 7 of protrusions 13 was 1 to 3 the average width 6 was 0.5 to 6 μm, and the average aspect ratio of the height to the width was 0.5 to 3.0. The protrusions 13 were formed on the surface of the tool body 12 so as to bite into the diamond film 5. The bumps 14 with a height of 1 to 3 μm were observed on the surface of the diamond film 5. As a result of the analysis of the composition on the cross-section of the protrusions 13 through Auger electron spectroscopy, it was confirmed that the upside of each of the protrusions 13 (the upper portion 8) is constituted by TaC and NbC 1 and the lower side of each of the protrusions (the lower portion 9) is constituted by WC particles 2 and Co (Co binder 4). Further, it was confirmed that the number of the bumps 14 with the width 10 of 3 to 20 μm per unit area is 500 to 10000/mm² in the arbitrary three visual fields with 100 μm square on the surface of the sample for surface observation of this embodiment. According to these results, the following effects can be achieved through the above-described method.

That is, in the first pretreatment step, Co (Co binder 4) is removed from the surface of the tool body 12. On the other hand, Co existing immediately under TaC and NbC 1 in the surface of the tool body 12 is not brought into contact with the acid etchant due to the TaC and NbC 1, and thus remains without removing. As a result, immediately under TaC and NbC 1, the bonding strength between the WC particles 2 is maintained due to the Co binder 4 remaining there. Therefore, in the second pretreatment step, although WC 2 is removed from the surface of the tool body 12 through the electrolytic etching, the WC particles 2 included in the protrusions 13 remain without removing. Thereby, the protrusions 13 are formed on the tool body 12, each of which the upper portion 8 is constituted by TaC or NbC and lower portion 9 is constituted by WC particles and Co. Then, the CVD process is performed on the surface of the tool body 12, thereby forming the diamond film 5 in a state where the protrusions 13 bite into the diamond film 5 as a wedge. Thus, the adhesion between the tool body 12 and the diamond film 5 is improved.

As described above, the adhesion of the film of the diamond-coated tool and the edge tip strength have a trade-off relationship with each other such that the edge tip strength degrades when the metallic binder (mainly, Co and Co alloy) is removed from the surface of the tool body 12 in order to improve the bonding strength (adhesion) between the tool body 12 and the diamond film 5. In this embodiment, the protrusions 13 is formed at a predetermined ratio on the surface of the tool body 12, each of which the upside (the upper portion 8) is constituted by TaC or NbC and the lower side (the lower portion 9) is constituted by WC and Co. Due to such characteristic constitutions of this embodiment, the adhesion between the surface of the tool body 12 and the diamond film 5 is improved. In this embodiment, the above-mentioned problem between the adhesion and the edge tip strength is solved through such a novel technical idea.

Next, Examples of the diamond-coated tool of this embodiment will be described in detail.

Here, a drill made of diamond-coated cemented carbide will be described as a specific example of the diamond-coated tool, although the present invention is not limited thereto. The present invention is applicable to various diamond-coated tools such as an insert made of diamond-coated cemented carbide and an end mill made of diamond-coated cemented carbide, which is indisputable.

EXAMPLE (a) WC powder, Co powder, TaC powder, and NbC powder were mixed as a raw powder in the proportions shown in Table 1, all of which had a predetermined average particle diameter within the range of 0.5 to 1.0 A binder (specifically, paraffin) and a solvent (specifically, toluene, xylene, mesitylene, tetralin, decalin or the like) were added to the mixed powders. They were blended by ball mill in acetone for 24 hours, and then dried under reduced pressure. Then, all of them were subjected to extrusion press molding to obtain round bar compacts with a diameter of 10 mm and a length of 150 mm. The round bar compacts were held under conditions shown in Table 2, that is, under the sintering conditions in a vacuum atmosphere of 1 Pa at 1380 to 1500° C. for 1 to 2 hours to be sintered, thereby obtaining the sintered bodies. Thereafter, the sintered bodies were polished, and thereby WC-based cemented carbide sintered bodies were produced.

Next, the WC-based cemented carbide sintered bodies were ground so as to have outer diameter of grooved portion of ϕ6.5 mm and the length of 80 mm, and thereby drill bodies made of WC-based cemented carbide (hereafter, referred to as "drill body") were produced.

(b) Next, the drill bodies were immersed in 1 liter of an acid mixed solution containing dilute sulfuric acid (0.5 volume %) and hydrogen peroxide (3 volume %) for 8 to 15 seconds at room temperature (23° C.), and thereby a part of metallic binder containing Co as a main component was removed from the vicinity of the surface of each of the drill bodies to a depth of 5 to 6 μm through etching (the first pretreatment step).

(c) These drill bodies were subjected to the electrolytic etching in 1 liter of etchant containing NaOH (80 to 120 g) for 30 minutes while an electric current is passed through the etchant in such a manner that the amount of the electric current per unit area is 1.5 to 2.5 A/dm$^2$, thereby removing WC from the surface of the drill bodies (the second pretreatment step).

(d) Next, the drill bodies were immersed in 1 liter of an acid mixed solution containing dilute sulfuric acid (0.5 volume %) and hydrogen peroxide (3 volume %) for 8 to 15 seconds at room temperature (23° C.), and thereby a part of metallic binder containing Co as a main component was removed from the vicinity of the surface of each of the drill bodies to a depth of 5 to 6 μm through etching (the third pretreatment step).

(e) Next, the drill bodies were subjected to scratching treatment by ultrasonic treatment in ethanol including diamond powder with a primal particle diameter of 0.1 μm or less, and then diamond powder was loaded into a hot-filament CVD apparatus. Then, while the filament temperature was set to 2200° C., the flow rate of flowing hydrogen gas and methane gas was set to 100:1, and the tool bodies were held at 900° C., a diamond film with a film thickness of 3 to 30 μm was formed.

By the producing process with the above-described steps (a) to (e), drills made of diamond-coated WC-based cemented carbide according to the embodiment (hereafter, referred to as "invention drill") 1 to 9 shown in Table 3 were produced. The steps (b) to (d) were performed under the conditions shown in Table 2.

In the producing process, shape of the protrusions formed on the surface of each of the tool bodies was controlled by adjusting the amount and the particle diameter of the raw powder of TaC or NbC constituting the cemented-carbide bodies and the temperature and the time for sintering the cemented carbide during the step (a), the amount of the applied electric current and the concentration of the etchant during the step (c), and the etching time.

For comparison, using the raw powders mixed in the proportions shown in Table 1, drill bodies were formed in the same manner of the step (a). The drill bodies were immersed in 1 liter of acid mixed solution containing dilute sulfuric acid (0.5 volume %) and hydrogen peroxide (3 volume %) at room temperature (23° C.) for treatment time (10 to 20 seconds) shown in Table 2, and thereby a part of metallic binder containing Co as a main component was removed from the vicinity of the surface of each of the drill bodies to a depth of 5 to 6 μm through etching (the first pretreatment step). Next, these drill bodies were subjected to the electrolytic etching under the conditions shown in Table 2, that is, in 1 liter of an alkali solution mixed with NaOH (100 g) for 20 to 60 minutes while an electric current is passed through the alkali solution in such a manner that the amount of the electric current per unit area is 0.5 to 3.5 A/dm² (the second pretreatment step). Then, the drill bodies were subjected to the third pretreatment step in the same manner as the invention drills for treatment time shown in Table 2 (the third pretreatment step). Thereby, the drills made of diamond-coated WC-based cemented carbide according to the comparative example (hereafter, referred to as "comparative drill") 1 to 11 shown in Table 3 were produced.

For reference, using the raw powders mixed in the proportions shown in Table 1, drill bodies were formed in the same manner as the step (a). The drill bodies were immersed in 1 liter of acid mixed solution containing dilute sulfuric acid (0.5 volume %) and hydrogen peroxide (3 volume %) at room temperature (23° C.) for treatment time (8 to 15 seconds) shown in Table 2, and thereby a part of metallic binder containing Co as a main component was removed from the vicinity of the surface of each of the drill bodies to a depth of 5 to 6 μm through etching (the first pretreatment step). Next, these drill bodies were subjected to the under the conditions shown in Table 2, that is, immersed in 1 liter of alkali solution mixed with potassium ferricyanide (100 g) and NaOH (100 g) at 45° C. for 30 to 60 minutes (the second pretreatment step). Then, the drill bodies were immersed in 1 liter of an acid mixed solution containing dilute sulfuric acid (0.5 volume %) and hydrogen peroxide (3 volume %) at room temperature (23° C.) for the treatment time (12 to 15 seconds) shown in Table 2, and thereby a part of metallic binder containing Co as a main component was removed from the vicinity of the surface of each of the drill bodies (the third pretreatment step). Thereby, drills made of diamond-coated WC-based cemented carbide according to the reference example (hereafter, referred to as "reference drill") 1 to 6 shown in Table 3 were produced.

TABLE 1

| Type | Composition of tool body (mass %) | | | |
|---|---|---|---|---|
| | Co | TaC | NbC | WC |
| Invention drill 1 | 6.0 | 0.7 | 0.3 | Balance |
| Invention drill 2 | 5.5 | 0.1 | 0.0 | Balance |
| Invention drill 3 | 8.0 | 3.0 | 0.0 | Balance |
| Invention drill 4 | 11.0 | 0.0 | 3.0 | Balance |
| Invention drill 5 | 7.5 | 1.5 | 0.3 | Balance |
| Invention drill 6 | 10.0 | 1.5 | 0.2 | Balance |
| Invention drill 7 | 15.0 | 1.0 | 0.3 | Balance |
| Invention drill 8 | 3.0 | 0.6 | 0.1 | Balance |
| Invention drill 9 | 4.0 | 1.2 | 0.3 | Balance |
| Comparative drill 1 | 5.0 | 0* | 0* | Balance |
| Comparative drill 2 | 6.5 | 4* | 0.3* | Balance |
| Comparative drill 3 | 7.0 | 0.05* | 0* | Balance |
| Comparative drill 4 | 2.5* | 1.0 | 0.2 | Balance |
| Comparative drill 5 | 5.0 | 3.5* | 0.2 | Balance |
| Comparative drill 6 | 20* | 1.5 | 0.3 | Balance |
| Comparative drill 7 | 5.0 | 0.3 | 0.3 | Balance |
| Comparative drill 8 | 6.0 | 0.5 | 0.3 | Balance |
| Comparative drill 9 | 8.0 | 3.0 | 0.0 | Balance |
| Comparative drill 10 | 7.5 | 1.5 | 0.3 | Balance |
| Comparative drill 11 | 10.0 | 1.5 | 0.2 | Balance |
| Reference drill 1 | 6.0 | 0.7 | 0.3 | Balance |
| Reference drill 2 | 5.5 | 1.0 | 0.0 | Balance |
| Reference drill 3 | 8.0 | 1.5 | 0.5 | Balance |
| Reference drill 4 | 8.0 | 2.0 | 0.3 | Balance |
| Reference drill 5 | 7.5 | 1.5 | 0.3 | Balance |
| Reference drill 6 | 3.0 | 1.5 | 0.2 | Balance |

Note:
Fields that are outside of the present invention are marked with *.

TABLE 2

| | Pretreatment step | | | | | |
|---|---|---|---|---|---|---|
| | First | Second pretreatment step | | | Third | |
| Type | pretreatment step Treatment time (sec) | Concentration of alkali solution (M) | Amount of electric current (A/dm²) | Treatment time (min) | pretreatment step Treatment time (sec) | Formation time of diamond film (hours) |
| Invention drill 1 | 10 | 2.5 | 1.5 | 30 | 12 | 43 |
| Invention drill 2 | 15 | 3 | 2 | 40 | 10 | 37 |
| Invention drill 3 | 8 | 2 | 1.5 | 35 | 10 | 40 |
| Invention drill 4 | 10 | 2.5 | 2 | 40 | 9 | 37 |
| Invention drill 5 | 12 | 2.5 | 1.3 | 25 | 10 | 40 |
| Invention drill 6 | 10 | 3 | 1.5 | 30 | 10 | 34 |
| Invention drill 7 | 10 | 2.5 | 2 | 35 | 8 | 46 |
| Invention drill 8 | 8 | 3 | 2.5 | 40 | 12 | 9 |
| Invention drill 9 | 8 | 3 | 2.5 | 30 | 10 | 57 |
| Comparative drill 1 | 10 | 0.4 | 1 | 40 | 10 | 29 |
| Comparative drill 2 | 15 | 2.5 | 2 | 50 | 12 | 46 |
| Comparative drill 3 | 10 | 2 | 2.5 | 40 | 13 | 23 |
| Comparative drill 4 | 10 | 2 | 2 | 50 | 13 | 14 |
| Comparative drill 5 | 12 | 2.5 | 2.5 | 30 | 13 | 57 |
| Comparative drill 6 | 10 | 2 | 2 | 45 | 12 | 43 |
| Comparative drill 7 | 10 | 4 | 3.5 | 60 | 12 | 29 |
| Comparative drill 8 | 10 | 2 | 3 | 45 | 12 | 34 |
| Comparative drill 9 | 12 | 3 | 2 | 50 | 12 | 29 |
| Comparative drill 10 | 12 | 1.5 | 0.5 | 20 | 15 | 46 |
| Comparative drill 11 | 10 | 2 | 1.5 | 45 | 14 | 57 |
| Reference drill 1 | 10 | 2 | — | 45 | 14 | 37 |
| Reference drill 2 | 15 | 2.5 | — | 60 | 15 | 40 |
| Reference drill 3 | 8 | 3 | — | 45 | 13 | 34 |
| Reference drill 4 | 10 | 2 | — | 30 | 13 | 23 |
| Reference drill 5 | 12 | 2.5 | — | 40 | 12 | 34 |
| Reference drill 6 | 10 | 2.5 | — | 40 | 13 | 14 |

By the above-described observation of the cross-section of each of the invention drills 1 to 9, the comparative drills 1 to 11, and the reference drills 1 to 6 using a scanning Here, in the examples in which the protrusions were not formed, since these values could not be measured, "—" are shown in Table 3.

TABLE 3

| Type | Height of protrusions formed on surface of tool body (μm) | Width of protrusions formed on surface of tool body (μm) | Aspect ratio of protrusions formed on surface of tool body | Height of bumps formed on surface of diamond film (μm) | Width of bumps formed on surface of diamond film (μm) | Number of protrusions formed on surface of tool body per unit area (/mm²) | Average film thickness of diamond film (μm) |
|---|---|---|---|---|---|---|---|
| Invention drill 1 | 2 | 1 | 2.0 | 2 | 5 | 8000 | 15 |
| Invention drill 2 | 3 | 5 | 0.6 | 3 | 10 | 500 | 13 |
| Invention drill 3 | 3 | 6 | 0.5 | 3 | 12 | 10000 | 14 |
| Invention drill 4 | 2.5 | 4 | 0.6 | 2.5 | 8 | 10000 | 13 |
| Invention drill 5 | 3 | 6 | 0.5 | 3 | 15 | 5000 | 14 |
| Invention drill 6 | 3 | 2 | 1.5 | 3 | 6 | 8000 | 12 |
| Invention drill 7 | 1 | 2 | 0.5 | 1 | 6 | 6000 | 16 |
| Invention drill 8 | 1.5 | 0.5 | 3.0 | 1.5 | 3 | 6000 | 3 |
| Invention drill 9 | 3 | 4 | 0.8 | 3 | 20 | 1000 | 20 |
| Comparative drill 1 | — | — | — | — | — | — | 10 |
| Comparative drill 2 | 3 | 1 | 3.0 | 3 | 4 | 14000* | 16 |
| Comparative drill 3 | 2 | 2 | 1.0 | 2 | 8 | 400* | 8 |
| Comparative drill 4 | 3 | 3 | 1.0 | 3 | 7 | 6000 | 5 |
| Comparative drill 5 | 3 | 3 | 1.0 | 3 | 6 | 12000* | 20 |
| Comparative drill 6 | 3 | 2 | 1.5 | 3 | 8 | 3000 | 15 |
| Comparative drill 7 | 2 | 0.5 | 4* | 2 | 3 | 800 | 10 |
| Comparative drill 8 | 3 | 9* | 0.33* | 3 | 21* | 1500 | 12 |
| Comparative drill 9 | 4* | 3 | 1.3 | 5* | 5 | 10000 | 10 |
| Comparative drill 10 | 0.5* | 0.5 | 1.0 | 0.5* | 3 | 1000 | 16 |
| Comparative drill 11 | 1 | 0.4* | 2.5 | 1 | 2* | 1500 | 20 |
| Reference drill 1 | — | — | — | — | — | — | 13 |
| Reference drill 2 | — | — | — | — | — | — | 14 |
| Reference drill 3 | — | — | — | — | — | — | 12 |
| Reference drill 4 | — | — | — | — | — | — | 8 |
| Reference drill 5 | — | — | — | — | — | — | 12 |
| Reference drill 6 | — | — | — | — | — | — | 5 |

Note:
Fields that are outside of the present invention are marked with *.

electron microscope, the film thickness of the diamond film thereof was measured at five points where no protrusions was formed in the observed visual field. Then, the average film thickness of each of the drills was calculated.

These values are shown in Table 3.

By the above-described observation of the cross-section of each of the invention drills 1 to 9, the comparative drills 1 to 11, and the reference drills 1 to 6 using a scanning electron microscope, the height, width, and aspect ratio of the height to the width of the protrusions formed on the surface of the tool body were measured, and the height and the width of the bumps formed on the surface of the diamond film were measured. Then, the arithmetic averages of each of them were calculated. As a result, it was confirmed that the protrusions observed in each of the invention drills 1 to 9 had: an average height of 1.0 to 3.0 μm; an average width of 0.5 to 6.0 μm; and an average aspect ratio of the height to the width of 0.5 to 3.0, and the bumps therein had: an average height of 1.0 to 3.0 μm; and an average width of 3.0 to 20.0 μm.

Further, by observation of the surface of each of the invention drills 1 to 9, the comparative drills 1 to 11, and the reference drills 1 to 6 using a scanning electron microscope, the number of the bumps per unit area (the number of the protrusions per unit area shown in Table 3) was measured. The results are shown in Table 3.

Next, using each of the invention drills 1 to 9, the comparative drills 1 to 11, and the reference drills 1 to 6 (all of which had a drill diameter of ϕ6.5 mm), high-speed drill test of CFRP was performed under the following conditions. Here, in the following conditions, typical cutting speed means a cutting speed which has optimal efficiency (which generally means the number of components that can be worked until the end of the service life of the tool, or the like) in a case where a conventional coated tool is used.

Workpiece: CFRP with thickness of 15 mm

Cutting speed: 240 m/min (typical cutting speed: 100 m/min)

Feed rate: 0.23 mm/rev

Drilling depth: 15 mm (through hole)

In each of the cutting test, at the time of recognizing abnormal noise or abnormal load during cutting, the test was stopped, and the presence or absence of peeling and fracture were observed. In the case where the peeling, fracture or the like was recognized, the number of drilled holes at that time was determined to be the end of the service life.

Further, when no fracture occurred until 100 holes were drilled and the wear state at a flank face of center of the cutting edge was normal wear (no fracture or chipping), the invention drill was determined to have passed.

These evaluation results are shown in Table 4.

TABLE 4

| Type | Test results | |
|---|---|---|
| | Number of drilled holes | Wear state |
| Invention drill 1 | 100 | Normal wear |
| Invention drill 2 | 100 | Normal wear |
| Invention drill 3 | 100 | Normal wear |
| Invention drill 4 | 100 | Normal wear |
| Invention drill 5 | 100 | Normal wear |
| Invention drill 6 | 100 | Normal wear |
| Invention drill 7 | 100 | Normal wear |
| Invention drill 8 | 100 | Normal wear |
| Invention drill 9 | 100 | Normal wear |
| Comparative drill 1 | 73 | Fracture |
| Comparative drill 2 | 75 | Fracture |
| Comparative drill 3 | 80 | Chipping |
| Comparative drill 4 | 60 | Fracture |
| Comparative drill 5 | 79 | Fracture |
| Comparative drill 6 | 5 | Chipping |
| Comparative drill 7 | 65 | Chipping |
| Comparative drill 8 | 52 | Fracture |
| Comparative drill 9 | 45 | Fracture |
| Comparative drill 10 | 70 | Chipping |
| Comparative drill 11 | 68 | Fracture |
| Reference drill 1 | 45 | Chipping |
| Reference drill 2 | 55 | Fracture |
| Reference drill 3 | 42 | Chipping |
| Reference drill 4 | 33 | Chipping |
| Reference drill 5 | 38 | Chipping |
| Reference drill 6 | 45 | Chipping |

As clear from the results shown in Tables 3 and 4, each of the invention drills 1 to 9 had a plurality of protrusions on the surface of the tool body which had a height of 1.0 to 3.0 μm; a width of 0.5 to 6.0 μm; and an aspect ratio of the height to the width of 0.5 to 3.0, each of which the upper portion was constituted by at least one of TaC and NbC and the lower portion under the upper portion was constituted by WC and Co. Further, the bumps formed on the surface of the diamond film due to the protrusions had a height of 1.0 to 3.0 μm and a width of 3.0 to 20.0 μm. The number of the bumps per unit area was 500 to 10000/mm². Thereby, in the high-speed drill cutting work of difficult-to-cut materials such as CFRP, superior edge tip strength was exhibited and excellent wear resistance in long-term usage was exhibited.

On the other hand, in each of the comparative drills 1 to 11 and the reference drills 1 to 6 in which the predetermined protrusions like the invention drills were not formed on the surface of the tool body, it was clear that the adhesion was inferior and the service life was short.

INDUSTRIAL APPLICABILITY

The cutting tool made of diamond-coated carbide of the present invention is applicable to various diamond-coated tools such as an insert made of diamond-coated cemented carbide and an end mill made of diamond-coated cemented carbide as well as a drill made of diamond-coated cemented carbide. Therefore, the cutting tool made of diamond-coated cemented carbide of the present invention exhibits excellent edge tip strength and wear resistance, and thus can satisfy the demand for energy saving and a reduction in cost in cutting work, the industrial applicability of which is extremely large.

REFERENCE SIGNS LIST

1 TaC or NbC
2 WC
3 PORE
4 Co BINDER
5 DIAMOND FILM
6 WIDTH OF PROTRUSION FORMED ON SURFACE OF TOOL BODY
7 HEIGHT OF PROTRUSION FORMED ON SURFACE OF TOOL BODY
8 UPPER PORTION
9 LOWER PORTION
10 WIDTH OF BUMP FORMED ON SURFACE OF DIAMOND FILM
11 HEIGHT OF BUMP FORMED ON SURFACE OF DIAMOND FILM
12 TOOL BODY
13 PROTRUSION
14 BUMP
100 CUTTING TOOL MADE OF DIAMOND-COATED CEMENTED CARBIDE

The invention claimed is:

1. A cutting tool made of diamond-coated cemented carbide, the cutting tool comprising:
   a tool body made of tungsten carbide-based cemented carbide including:
      3 to 15 mass % of Co;
      at least one of TaC and NbC of which a total amount is 0.1 to 3.0 mass %; and
      a balance including WC; and
   a diamond film coating the tool body,
   wherein the tool body has a plurality of protrusions on a surface of the tool body, of which an average height is 1.0 to 3.0 μm, an average width is 0.5 to 6.0 μm, and an average aspect ratio of the height to the width is 0.5 to 3.0;
   an upper portion of each of the protrusions is made of the at least one of TaC and NbC;
   a lower portion of each of the protrusions is made of WC and Co, the lower portion being under the upper portion; and
   a portion of Co is removed in a region of the tool body between the surface of the tool body and a depth of 6 μm from the surface.

2. The cutting tool made of diamond-coated cemented carbide according to claim 1, wherein the number of the protrusions per unit area is 500 to 10000/mm².

3. The cutting tool made of diamond-coated cemented carbide according to claim 1, wherein an average film thickness of the diamond film is 3 to 30 μm.

4. The cutting tool made of diamond-coated cemented carbide according to claim 1, wherein
   the diamond film has a plurality of bumps on a surface of the diamond film, of which an average height is 1.0 to 3.0 μm, and an average width is 3.0 to 20.0 μm.

5. The cutting tool made of diamond-coated cemented carbide according to claim 4, wherein the number of the bumps per unit area is 500 to 10000/mm².

6. The cutting tool made of diamond-coated cemented carbide according to claim 1, wherein a Co content is 2 to 13 mass % in the lower portion.

7. The cutting tool made of diamond-coated cemented carbide according to claim 1, wherein a total amount of the at least one of TaC and NbC is 95 to 100 mass % in the upper portion.

8. A method for producing the cutting tool made of diamond-coated cemented carbide according to claim 1, the method comprising:
   a granulating step of granulating a Co powder, at least one of a TaC powder and a NbC powder, and a WC powder using a spray dryer at 190 to 210° C.;

a sintering step of: mixing the granulated Co powder, the at least one of TaC powder and NbC powder, and the WC powder with each other to obtain a mixture and then holding the mixture at 0.1 to 10 Pa and 1380 to 1500° C. for 1 to 2 hours to sinter the mixture and form the tool body;

a first pretreatment step of immersing the tool body in an acid solution containing 0.4 to 1.0 volume % of dilute sulfuric acid and 2 to 5 volume % of hydrogen peroxide water at room temperature for 15 to 25 seconds;

a second pretreatment step of subjecting the tool body which has been subjected to the first pretreatment step to electrolytic etching by immersing the tool body in an alkaline etchant with a concentration of 5 to 15 volume % containing sodium hydroxide for 30 to 60 minutes while an electric current at 1.5 to 2.5 $A/dm^2$ is passed through the alkaline etchant;

a third pretreatment step of immersing the tool body which has been subjected to the second pretreatment step in an acid solution containing 0.4 to 1.0 volume % of dilute sulfuric acid and 2 to 5 volume % of hydrogen peroxide water at room temperature for 8 to 15 seconds; and a step of coating the tool body which has been subjected to the third pretreatment step with the diamond film.

9. The cutting tool made of diamond-coated cemented carbide according to claim 1, a portion of the surface of the tool body where protrusions are not formed is substantially flat.

* * * * *